US006601225B2

United States Patent
Ohno

(10) Patent No.: US 6,601,225 B2
(45) Date of Patent: Jul. 29, 2003

(54) SEMICONDUCTOR DEVICE HAVING DEFINITE SIZE OF INPUT/OUTPUT BLOCKS AND ITS DESIGNING METHOD

(75) Inventor: Tsuyoshi Ohno, Kawasaki (JP)

(73) Assignee: NEC Electronics Corporation, Kanagawa (JP)

( * ) Notice: Subject to any disclaimer, the term of this patent is extended or adjusted under 35 U.S.C. 154(b) by 0 days.

(21) Appl. No.: 09/899,351

(22) Filed: Jul. 5, 2001

(65) Prior Publication Data

US 2002/0004930 A1 Jan. 10, 2002

(30) Foreign Application Priority Data

Jul. 6, 2000 (JP) ......................................... 2000-204920

(51) Int. Cl.[7] ............................................... G06F 17/50
(52) U.S. Cl. ............................................. 716/8; 716/11
(58) Field of Search .......................... 716/1, 8, 11, 17, 716/18

(56) References Cited

U.S. PATENT DOCUMENTS 4,523,106 A * 6/1985 Tanizawa et al. ............. 716/17
4,942,317 A * 7/1990 Tanaka et al. ................ 716/17
5,155,065 A * 10/1992 Schweiss ....................... 716/8
5,547,740 A * 8/1996 Higdon et al. ................ 716/17
5,946,477 A * 8/1999 Ito ................................. 716/8
5,978,880 A * 11/1999 Bruce et al. .................... 716/1

FOREIGN PATENT DOCUMENTS

JP          4-127556        4/1992   ........... H01L/21/82

* cited by examiner

Primary Examiner—Trong Phan

(57) ABSTRACT

In a semiconductor device including an internal circuit provided in an internal circuit area; input/output blocks provided in input/output areas surrounding the internal circuit area, each of the input/output blocks being connected by first conductive layer to the internal circuit; and pads provided in outer areas of the input/output areas, each of the pads being connected by a second conductive layer to one of the input/output blocks, the configuration of each of the input/output blocks being definite regardless of the pitch of the pads, the number of rows of the input/output blocks in the input/output areas is changed in accordance with the pitch of the pads.

14 Claims, 11 Drawing Sheets

SEMICONDUCTOR DEVICE HAVING DEFINITE SIZE OF INPUT/OUTPUT BLOCKS AND ITS DESIGNING METHOD

BACKGROUND OF THE INVENTION

1. Field of the Invention

The present invention relates to a semiconductor device and its designing method, and more particularly, to the improvement of a layout of input/output (I/O) blocks.

2. Description of the Related Art

A first prior art semiconductor device includes an internal circuit provided in an internal circuit area; I/O blocks provided in I/O areas surrounding the internal circuit area, with each of the input/output blocks being connected by first conductive layers to the internal circuit. Pads are provided in outer areas of the input/output areas, with each of the pads being connected by a second conductive layer to one of the input/output blocks. The I/O blocks are arranged in series in one row. This will be explained later in detail.

In the above-described first prior art semiconductor device, however, because the I/O blocks are arranged in one row within the I/O areas, the pitch of the is the same as that of the I/O blocks. Therefore, when the number of the pads is changed to alter the pitch of the pads, the configuration of each of the I/O blocks has to be changed. This makes the design of semiconductor devices more complex. Thus, if the pitch of the pads is changed, I/O blocks have to be redesigned, which increases the manufacturing cost.

In a second prior art semiconductor device (see FIG. 3 in JP-A-4-127556), two rows of I/O blocks are provided in the I/O areas. Therefore, the I/O blocks can be used without changing the configuration thereof in some kinds of semiconductor devices. This also will be explained later in detail.

In the above-described second prior art semiconductor device, however, there are limited kinds of semiconductor devices to which the same I/O blocks can be applied. This makes the design of semiconductor devices more complex.

SUMMARY OF THE INVENTION

It is an object of the present invention to simplify the design of I/O blocks of semiconductor devices.

According to the present invention, in a semiconductor device including an internal circuit provided in an internal circuit area; I/O blocks provided in I/O areas surrounding the internal circuit areas, each of the input/output blocks being connected by first conductive layers to the internal circuit; and pads provided in outer areas of the input/output areas, each of the pads being connected by a second conductive layer to one of the input/output blocks, the configuration of each of the input/output blocks is fixed regardless of the pitch of the pads, and the number of rows of the input/output blocks in the input/output areas is changed in accordance with the pitch of the pads.

BRIEF DESCRIPTION OF THE DRAWINGS

The present invention will be more clearly understood from the description set forth below, as compared with the prior art, and with reference to the accompanying drawings, wherein.

DESCRIPTION OF THE PREFERRED EMBODIMENTS

Before the description of the preferred embodiments of the Applicant's invention, the prior art semiconductor devices will be explained with reference to FIGS. 1A, 1B, 2A, 2B and 3.

Figure 1A:
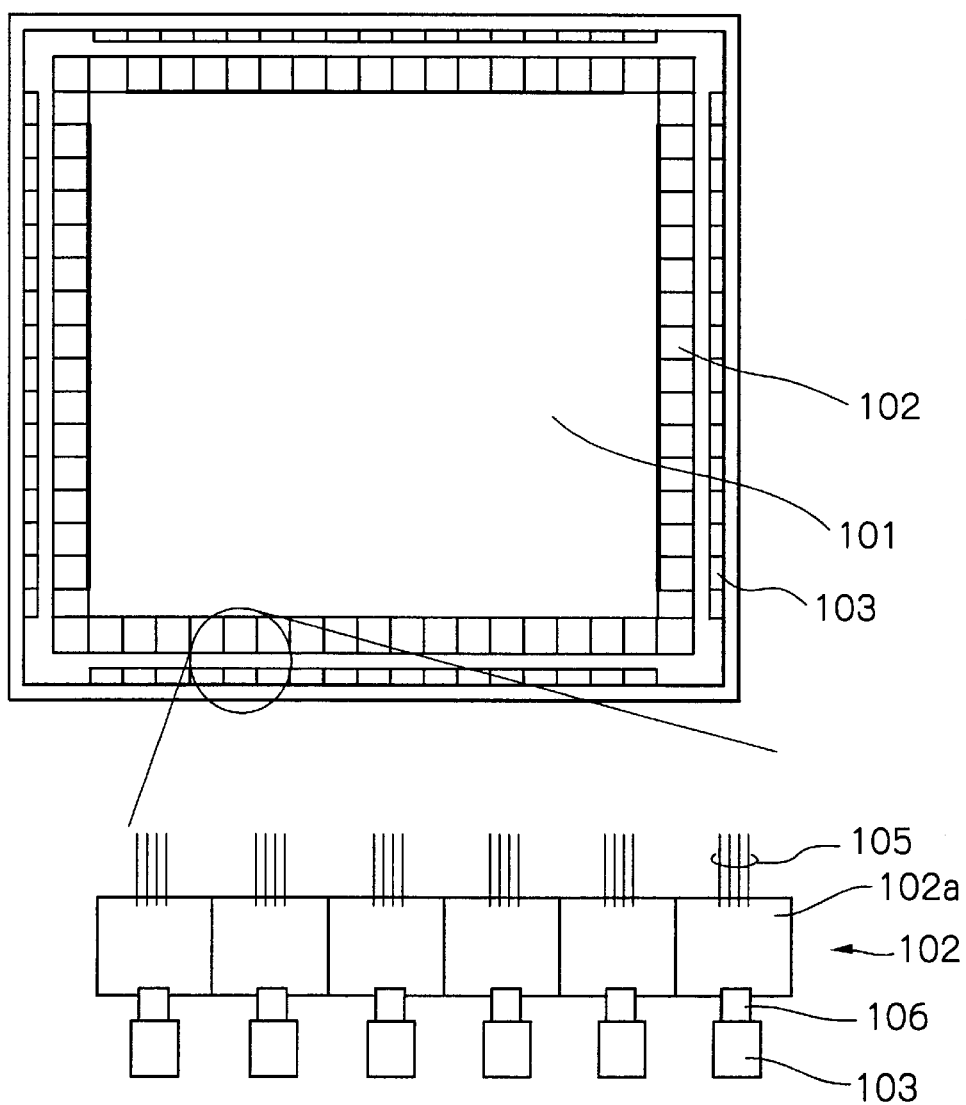
FIGS. 1A and 1B are plan views illustrating a first prior art semiconductor device.
Figure 1B:
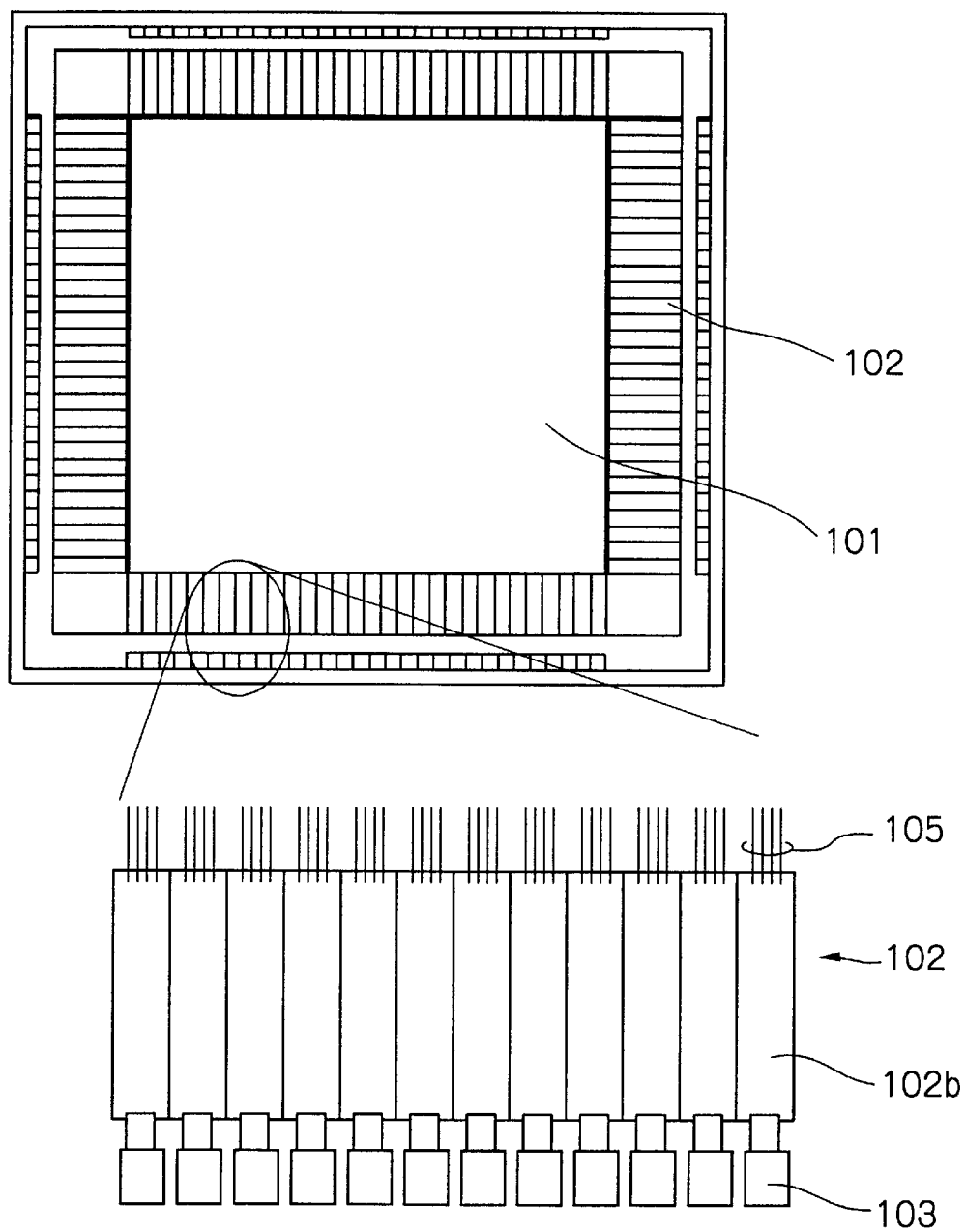

In FIGS. 1A and 1B, which illustrate a first prior art semiconductor device, a semiconductor device is constructed by an internal circuit area 101. An internal circuit provides for four I/O areas 102 arranged in the periphery of the internal circuit area 101, and pads 103 arranged in the outer areas of the I/O areas 102.

Figure 2A:
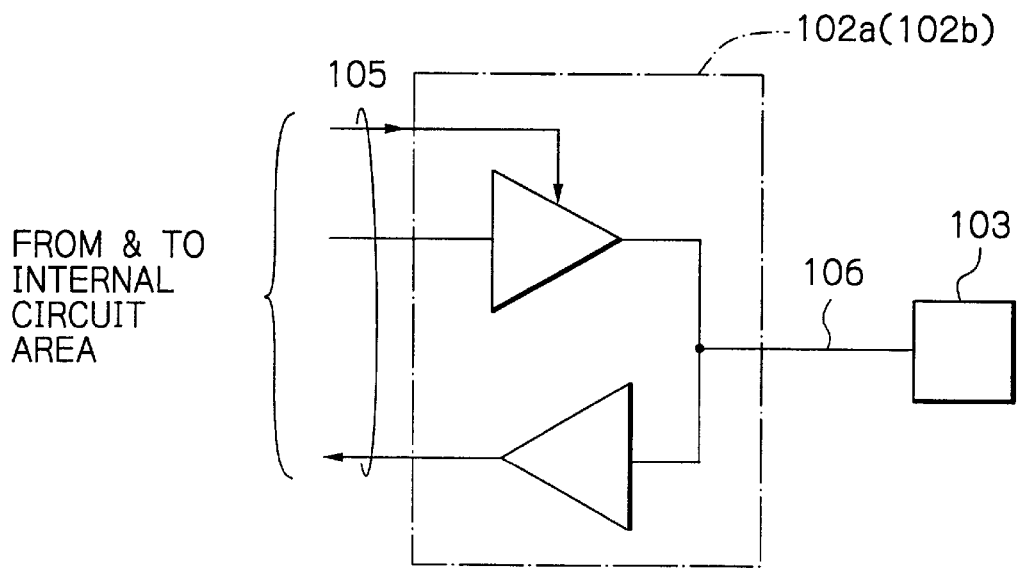
FIGS. 2A and 2B are circuit diagrams illustrating examples of the I/O blocks of FIGS. 1A and 1B.
Figure 2B:
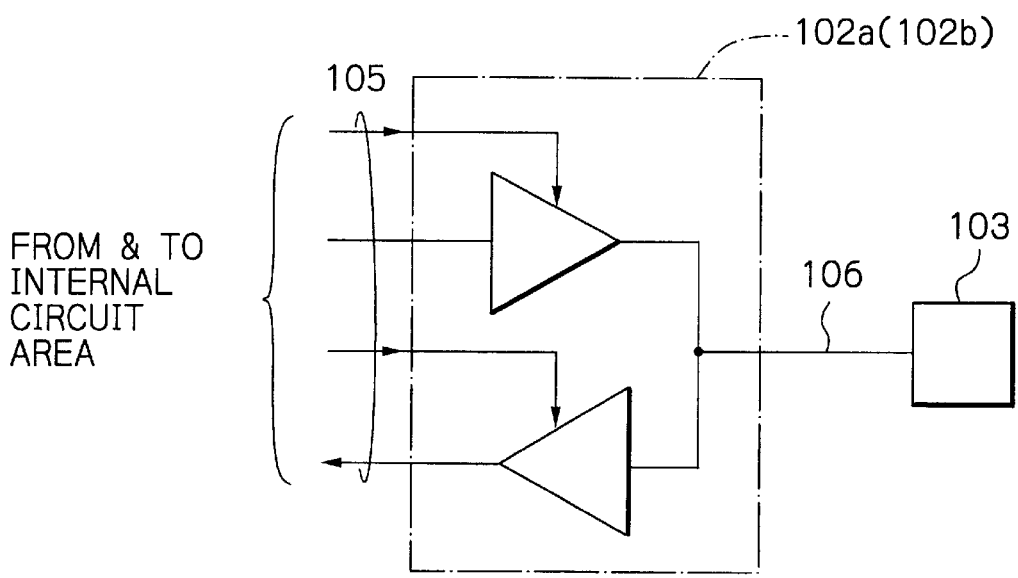

Each of the I/O areas 102 is constructed by a plurality of I/O blocks 102a or 102b closely arranged in series with each other. As illustrated in FIGS. 2A and 2B, an input buffer and/or an output buffer are provided in each of the I/O blocks 102a or 102b.

Each of the I/O blocks 102a (102b) is connected by conductive layers 105 to the internal circuit area 101 and is also connected by a conductive layer 106 to one of the pads 103.

In FIGS. 1A and 1B, because the I/O blocks 102a (102b) are arranged in one row within the I/O areas 102, the pitch of the pads 103 is the same as that of the I/O blocks 102a (102b). Therefore, when the number of the pads 103 is changed to alter the pitch of the pads 103, the configuration of each of the I/O blocks 102a (102b) has to be changed, which makes the design of semiconductor devices more complex. For example, in FIG. 1A, because the pitch of the pads 103 is relatively large, the I/O blocks 102a are approximately square, while, in FIG. 1B, since the pitch of the pads 103 is relatively small, the I/O blocks 102b are rectangular. Thus, if the pitch of the pads 103 is changed, the I/O blocks have to be redesigned, which increases the manufacturing cost.

Figure 3:
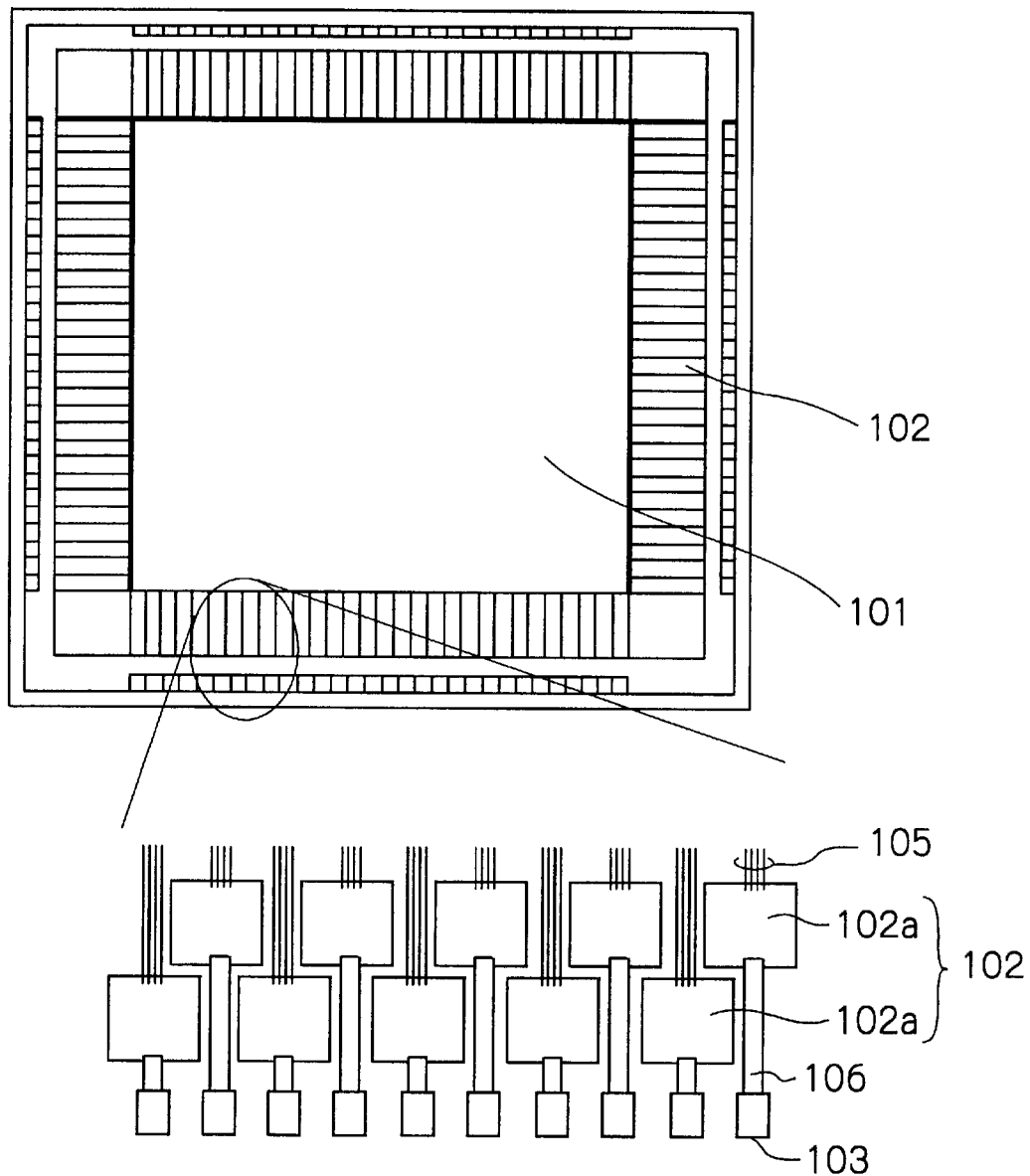
FIG. 3 is a plan view illustrating a second prior art semiconductor device.

In FIG. 3, which illustrates a second prior art semiconductor device (see FIG. 3 in JP-A-4-127556), when the pitch of the pads 103 is increased, it is possible to have two rows of I/O blocks 102a in the I/O areas 102. Therefore, the I/O blocks 102a can be used without changing the configuration thereof in some kinds of semiconductor devices.

In the semiconductor device of FIG. 3, however, there are limited kinds of semiconductor devices to which the same I/O blocks 102a can be applied and still makes the design of semiconductor devices more complex. Additionally, because the conductive layers 105 and 106 are provided between the I/O blocks 102a, the semiconductor devices are increased in size. Further, because the conductive layers 105 and 106 are provided at the middle of the I/O blocks 102a, it is impossible to provide three or more rows of I/O blocks in the I/O areas 102; therefore the number of the pads 103 cannot be increased.

In the present invention, the configuration of I/O blocks is the same regardless of the circuit and the pitch of the pads.

Figure 4:
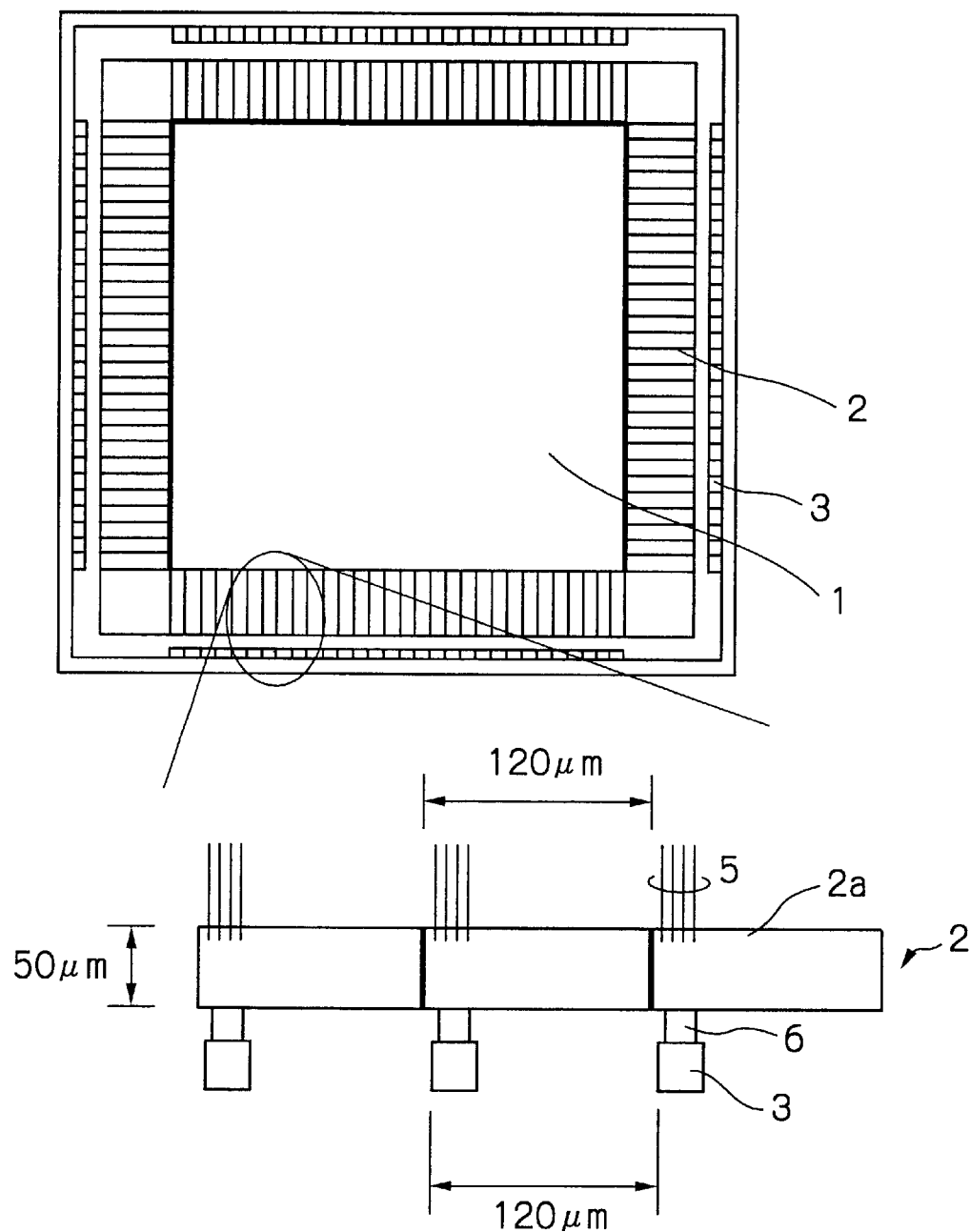
FIGS. 4, 5, 6, 7, 8 and 9 are plan views illustrating first, second, third, fourth, fifth and sixth embodiments, respectively, of the semiconductor device according to the present invention.

In FIG. 4, which illustrates a first embodiment of the present invention, a semiconductor device is constructed by an internal circuit area 1, four I/O areas 2 arranged in the periphery of the internal circuit area 1, and pads 3 arranged in the outer areas of the I/O areas 2.

Each of the I/O areas 2 is formed by a plurality of I/O blocks 2a closely arranged in one row, and each of the I/O blocks 2a is connected by conductive layers 5 to the internal circuit area. They are also connected by a conductive layer 6 to one of the pads 3. Also, the conductive layers 5 are arranged in line with the conductive layer 6, and the conductive layers 5 and 6 are arranged on a side of the I/O blocks 2a. This could increase the number of the pads 3.

In FIG. 4, the size of the I/O blocks 2a is fixed. For example, the width and length of the I/O blocks 2a are 120 μm and 50 μm, respectively. Therefore, the pitch of the I/O blocks 2a is 120 μm. On the other hand, the pitch of the pads 3 is also 120 μm. Thus, because the ratio of the pitch of the I/O blocks 2a to that of the pads 3 is 1, the number of rows of the I/O blocks 2a in the I/O areas 2 is 1.

Figure 5:
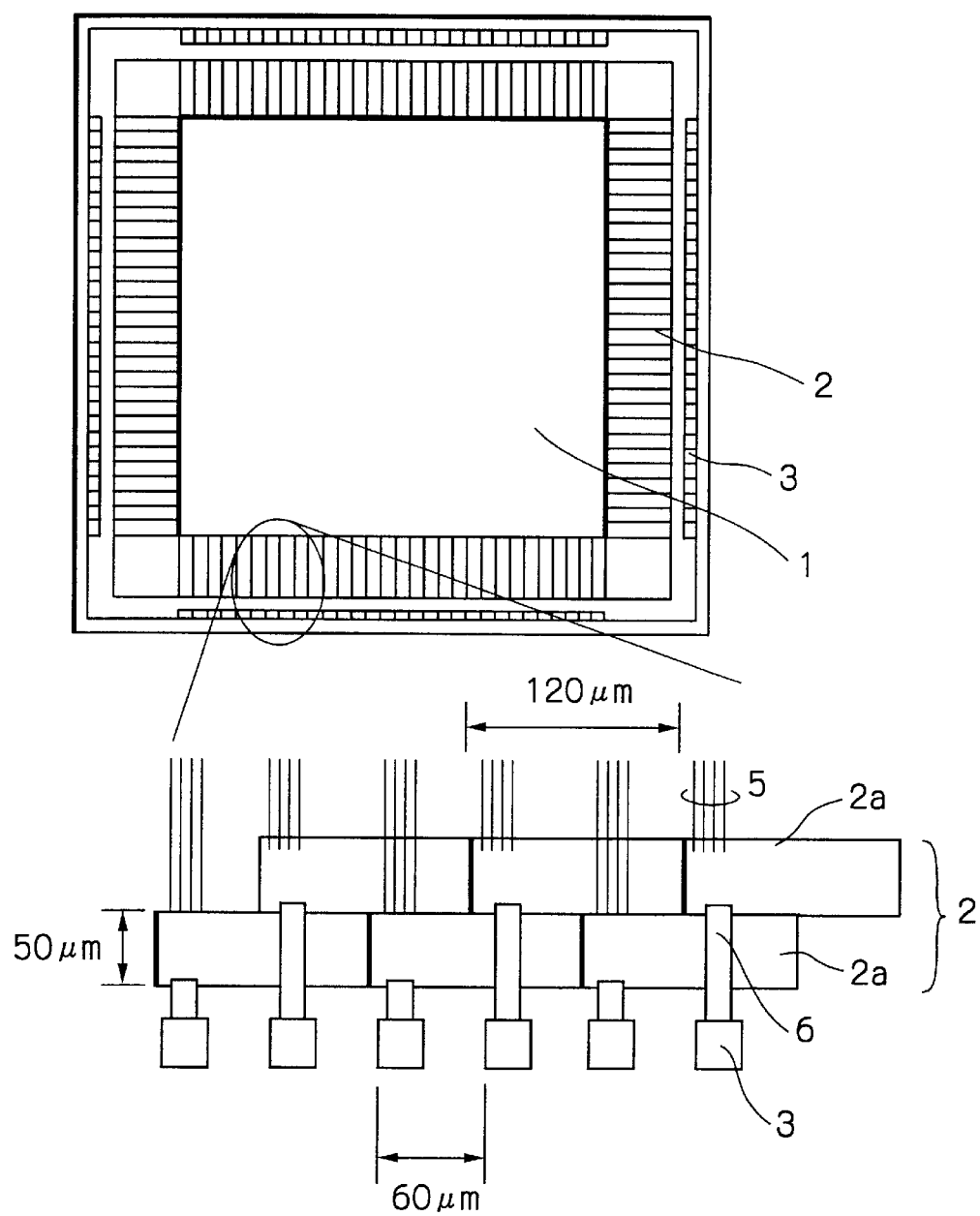

In FIG. 5, which illustrates a second embodiment of the present invention, each of the I/O areas 2 is formed by a plurality of I/O blocks 2a closely arranged in two rows. Note that the size of the I/O blocks 2a is the same as those of FIG. 4. In this case, although the width of the I/O blocks 2a is 120 μm, the pitch of the pads 3 is 60 μm. Thus, because the ratio of the width of the I/O blocks 2a to the pitch of the pads 3 is 2, the number of rows of the I/O blocks 2a in the I/O areas 2 is 2. In this case, the two rows of the I/O blocks 2a are shifted by 60 μm with respect to each other.

Additionally, in FIG. 5, the conductive layers 5 and 6 are partly arranged on the I/O blocks 2a. This decreases the size of the semiconductor device of FIG. 5.

Figure 6:
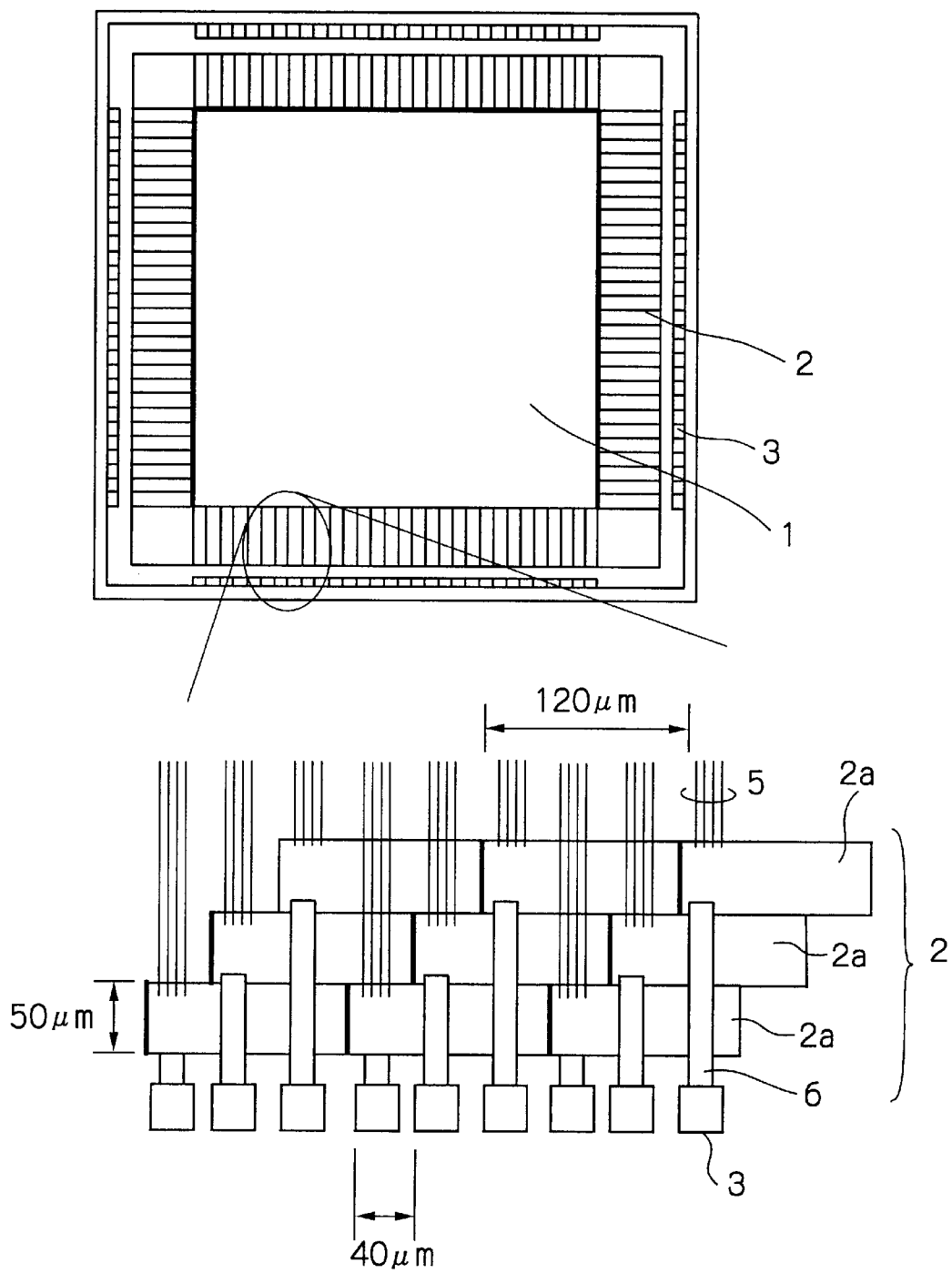

In FIG. 6, which illustrates a third embodiment of the present invention, each of the I/O areas 2 is formed by a plurality of I/O blocks 2a closely arranged in three rows. Note that the size of the I/O blocks 2a is the same as those of FIGS. 4 and 5. In this case, although the width of the I/O blocks 2a is 120 μm, the pitch of the pads 3 is 40 μm. Thus, since the ratio of the width of the I/O blocks 2a to the pitch of the pads 3 is 3, the number of rows of the I/O blocks 2a in the I/O areas 2 is 3. In this case, the three rows of the I/O blocks 2a are shifted by 40 μm with respect to each other.

Additionally, in FIG. 6, the conductive layers 5 and 6 are partly arranged on the I/O blocks 2a. This also decreases the size of the semiconductor device of FIG. 6.

Figure 7:
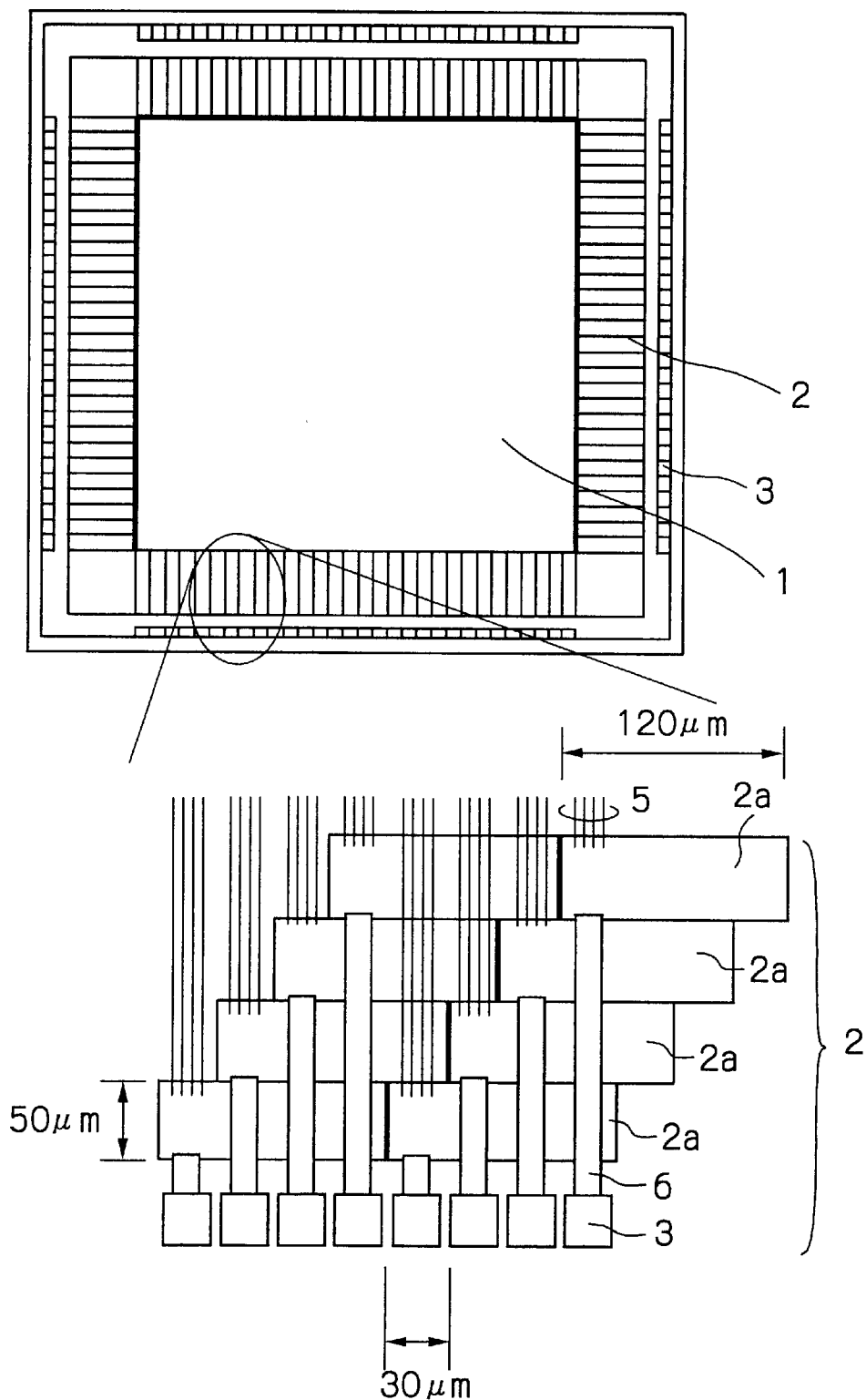

In FIG. 7, which illustrates a fourth embodiment of the present invention, each of the I/O areas 2 is formed by a plurality of I/O blocks 2a closely arranged in four rows. Note that the size of the I/O blocks 2a is the same as those of FIGS. 4, 5 and 6. In this case, although the width of the I/O blocks 2a is 120 μm, the pitch of the pads 3 is 30 μm. Thus, because the ratio of the width of the I/O blocks 2a to the pitch of the pads 3 is 4, the number of rows of the I/O blocks 2a in the I/O areas 2 is 4. In thus case, the four rows of the I/O blocks 2a are shifted by 30 μm with respect to each other.

Additionally, in FIG. 7, the conductive layers 5 and 6 are partly arranged on the I/O blocks 2a. This also decreases the size of the semiconductor device of FIG. 7.

Generally, in the present invention, if the ratio of the width of the I/O blocks 2a to the pitch of the pads 3 is N, the number of rows of the I/O blocks 2a in the I/O areas 2 is N. On the other hand, if the ratio of the width of the I/O blocks 2a to the pitch of the pads 3 is N+α(N=0, 1, 2, ..., ∞ and 0<α<1), the number of rows of the I/O blocks 2a in the I/O areas 2 is N+1.

Figure 8:
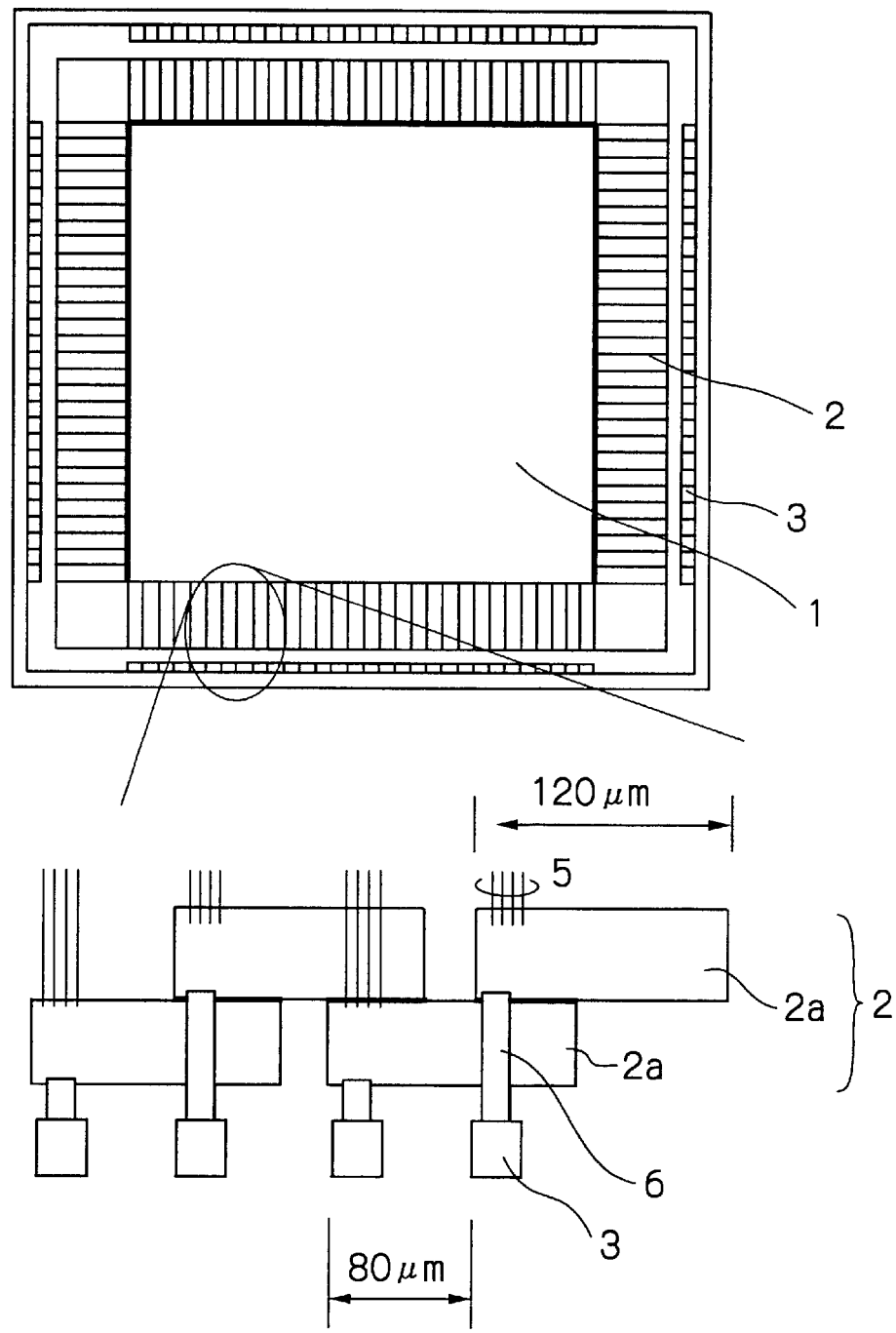

In FIG. 8, which illustrates a fifth embodiment of the present invention, each of the I/O areas 2 is formed by a plurality of I/O blocks 2a closely arranged in two rows. Note that the size of the I/O blocks 2a is the same as those of FIGS. 4, 5, 6 and 7. In this case, although the width of the I/O blocks 2a is 120 μm, the pitch of the pads 3 is 80 μm. Thus, because the ratio of the width of the I/O blocks 2a to the pitch of the pads 3 is 1.5, the number of rows of the I/O blocks 2a in the I/O areas 2 is 2. In this case, the 2 rows of the I/O blocks 2a are shifted by 80 μm with respect to each other.

Additionally, in FIG. 8, the conductive layers 5 and 6 are partly arranged on the I/O blocks 2a, which also decreases the size of the semiconductor device of FIG. 8.

Figure 9:
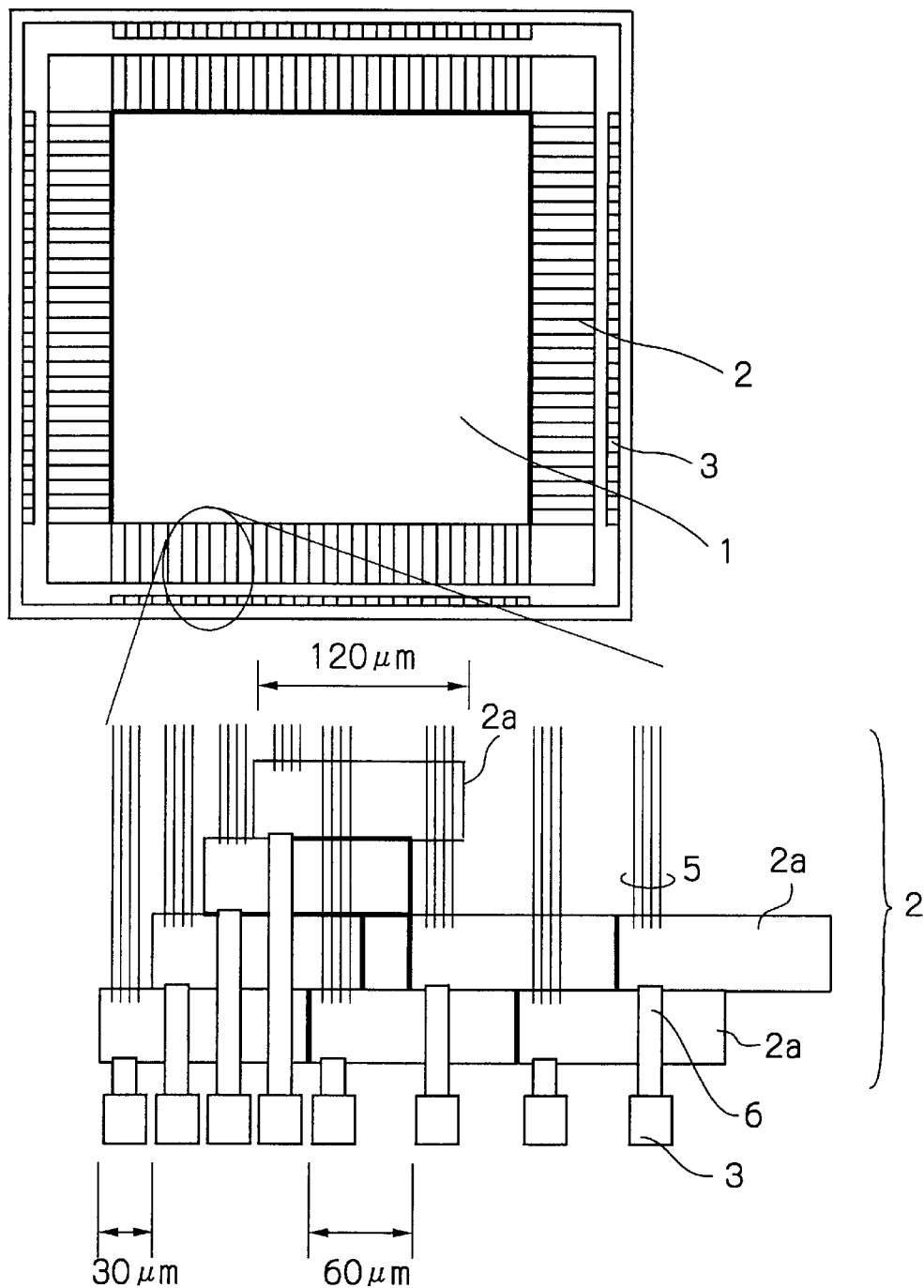

In FIG. 9, which illustrates a sixth embodiment of the present invention, each of the I/O areas 2 is formed by a plurality of I/O blocks 2a closely arranged in four rows and in two rows. Note that the size of the I/O blocks 2a is the same as those of FIGS. 4, 5, 6, 7 and 8. In this case, although the width of the I/O blocks 2a is 120 μm, the pitch of the pads 3 is 30 μm in a first part and 60 μm in a second part. Thus, the number of rows of the I/O blocks 2a in the I/O areas 2 is 4 in the first part and in the second part. In this case, the four rows of the I/O blocks 2a are shifted by 30 μm with respect to each other.

Additionally, in FIG. 9, the conductive layers 5 and 6 are partly arranged on the I/O blocks 2a, which also decreases the size of the semiconductor device of FIG. 9.

Figure 10A:
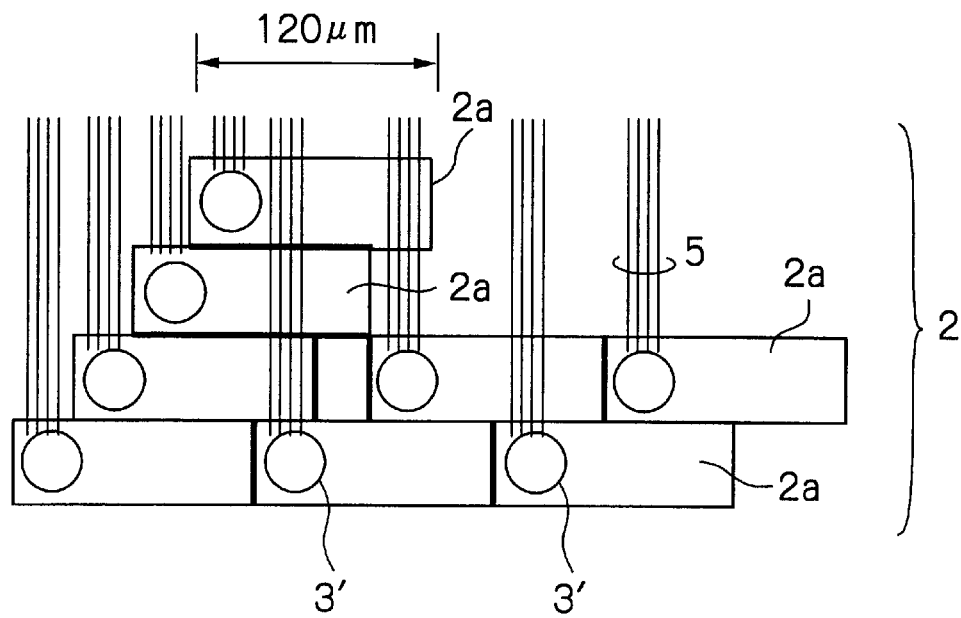
FIGS. 10A and 10B are plan views illustrating modifications of the semiconductor device of FIG. 9.
Figure 10B:
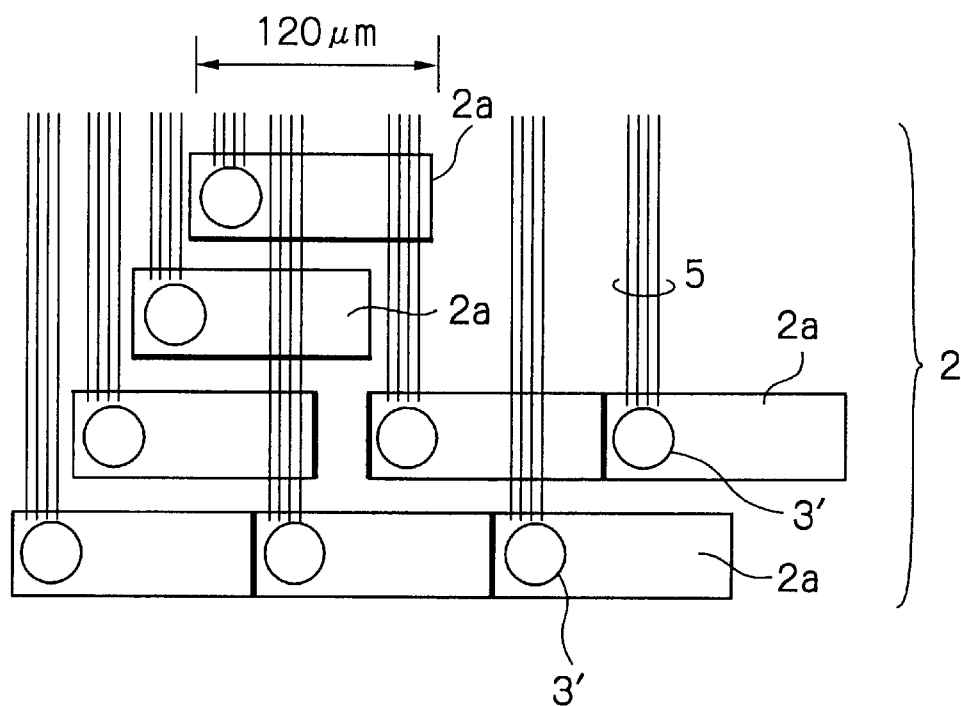

The above-described embodiments can be applied to semiconductor devices of a flip-chip package. For example, the semiconductor device of FIG. 9 is modified to a semiconductor device as illustrated in FIGS. 10A and 10B, where the pads 3 of FIG. 9 are replaced by solder bumps 3'. In FIG. 10B, the rows of the I/O blocks 2a are separated in order to prevent the solder bumps 3' from being short-circuited.

As explained hereinabove, according to the present invention, because the configuration of I/O blocks is fixed regardless of the circuit and the pitch of pads (or solder bumps), the design of semiconductor devices can be simplified, which could decrease the manufacturing cost.

What is claimed is:

1. A semiconductor device comprising:
    an internal circuit provided in an internal circuit area;
    a first conductive layer;
    input/output blocks provided in input/output areas surrounding said internal circuit area, each of said input/output blocks being connected by said first conductive layer to said internal circuit, said input/output blocks being arranged in a number of rows wherein said number of rows is one or more;
    a second conductive layer; and
    pads provided in outer areas of said input/output areas, said pads having a pitch, each of said pads being connected by said second conductive layer to one of said input/output blocks, at least one dimension of each of said input/output blocks being fixed regardless of the pitch of said pads,
    the number of rows of said input/output blocks in said input/output areas being variable in accordance with the pitch of said pads.

2. The device as set forth in claim 1, wherein, if W/P=N+α where W is a width of any said input/output blocks along a direction of said pads and P is the pitch of said pads, the number of rows of said input/output blocks in said input/output areas is N where α=0 and is N+1 where 0<α<1 and N is zero or a positive integer.

3. The device as set forth in claim 1, wherein said first conductive layers are in line with said second conductive layer in each of said input/output blocks, and said first and second conductive layers are arranged at a side of each of said input/output blocks.

4. The device as set forth in claim 1, wherein the rows of said input/output blocks are closely arranged.

5. A method for designing a semiconductor device comprising the steps of:

arranging an internal circuit in an internal circuit area;

providing a first conductive layer;

arranging input/output blocks in input/output areas surrounding said internal circuit area, each of said input/output blocks being connected by said first conductive layer to said internal circuit, said input/output blocks being arranged in a number of rows wherein said number of rows is one or more;

providing a second conductive layer; and arranging pads in outer areas of said input/output areas, each of said pads being connected by said second conductive layer to one of said input/output blocks, at least one dimension of each of said input/output blocks being fixed regardless of a pitch of said pads, the number of rows of said input/output blocks in said input/output areas being variable in accordance with the pitch of said pads.

6. The method as set forth in claim 5, wherein, if $W/P=N+\alpha$ where W is a width of any said input/output blocks along a direction of said pads and P is the pitch of said pads, the number of rows of said input/output blocks in said input/output areas is N where $\alpha=0$ and is N+1 where $0<\alpha<1$ and N is zero or a positive integer.

7. The method as set forth in claim 5, wherein said first conductive layers are in line with said second conductive layer in each of said input/output blocks, and said first and second conductive layers are arranged at a side of each of said input/output blocks.

8. The method as set forth in claim 5, wherein the rows of said input/output blocks are closely arranged.

9. A flip-chip type semiconductor device comprising:

an internal circuit provided in an internal circuit area;

a first conductive layer;

input/output blocks provided in input/output areas surrounding said internal circuit area, each of said input/output blocks being connected by said first conductive layer to said internal circuit, said input/output blocks being arranged in a number of rows wherein said number of rows is one or more;

a second conductive layer; and solder bumps provided in said input/output areas, at least one dimension of each of said input/output blocks being definite regardless of a pitch of said solder bumps.

10. The device as set forth in claim 9, wherein the rows of said input/output blocks are closely arranged.

11. The device as set forth in claim 9, wherein the rows of said input/output blocks are separately arranged.

12. A method for designing a flip-chip type semiconductor device comprising the steps of:

arranging an internal circuit in an internal circuit area;

providing a first conductive layer;

arranging input/output blocks in input/output areas surrounding said internal circuit area, each of said input/output blocks being connected by said first conductive layer to said internal circuit; and arranging solder bumps in said input/output areas, at least one dimension of each of said input/output blocks being definite regardless of the pitch of said solder bumps, said input/output blocks being arranged in a number of rows wherein said number of rows is one or more.

13. The method as set forth in claim 12, wherein the rows of said input/output blocks are closely arranged.

14. The method as set forth in claim 12, wherein the rows of said input/output blocks are separately arranged.

* * * * *